United States Patent [19]
Imaizumi et al.

[11] 3,801,886
[45] Apr. 2, 1974

[54] VARIABLE RESISTANCE ELEMENT

[75] Inventors: Ichiro Imaizumi, Kokubunji; Kenji Taniguchi, Kodaira; Atsuo Hotta, Kokubunji, all of Japan

[73] Assignee: Hitachi, Ltd., Tokyo, Japan

[22] Filed: June 6, 1973

[21] Appl. No.: 367,417

Related U.S. Application Data

[63] Continuation-in-part of Ser. No. 151,121, June 8, 1971, abandoned.

[30] Foreign Application Priority Data

June 12, 1970 Japan ..................... 45-50257

[52] U.S. Cl....... 317/235 R, 317/235 E, 317/235 Z, 317/235 AE

[51] Int. Cl. ........................ H01l 19/00

[58] Field of Search....... 317/235 E, 235 AE, 235 Z

[56] References Cited

UNITED STATES PATENTS

| | | | |
|---|---|---|---|
| 3,416,049 | 12/1968 | Bohn et al. | 317/235 E |
| 3,560,814 | 2/1971 | Enghert et al. | 317/235 AE |
| 3,510,735 | 5/1970 | Potter | 317/235 AE |
| 3,631,309 | 12/1971 | Myers | 317/235 AE |

*Primary Examiner*—Rudolph V. Rolinec
*Assistant Examiner*—William D. Larkins
*Attorney, Agent, or Firm*—Craig and Antonelli

[57] ABSTRACT

A variable resistance element comprising a planar transistor of which the base region has a pinched base region having a high resistance and placed between the emitter region and collector region, a first metal electrode provided at one end portion of the base region, a second metal electrode provided on the same side as the first metal electrode with respect to the emitter region in a manner to bridge the base region and emitter region, and a third metal electrode provided on the opposite side to the first and second metal electrodes with respect to the emitter region.

5 Claims, 16 Drawing Figures

VARIABLE RESISTANCE ELEMENT

CROSS REFERENCE TO RELATED APPLICATION

This application is a continuation-in-part application of our copending application, Ser. No. 151,121 filed on June 8, 1971, now abandoned.

FIELD OF THE INVENTION

This invention relates to a semiconductor variable resistance element the resistance of which varies according to the applied voltage.

DESCRIPTION OF THE PRIOR ART

Recently, complication in various electrical circuits has increased the need for variable resistance elements. Particularly in the field of IC's and LSI's, those variable resistance elements which can be integrated with other electric circuit components have been in increasing demand.

Figure 1:
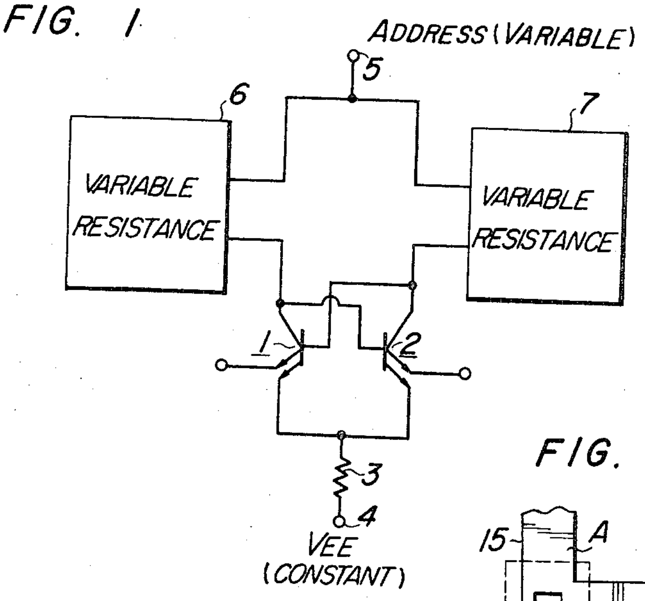
FIG. 1 is a circuit diagram of a memory cell utilizing two multi-emitter transistors.
Figure 2:
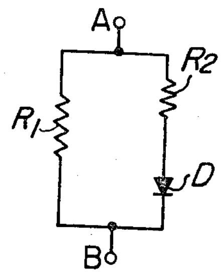
FIG. 2 is an equivalent circuit diagram of an well known variable resistance element.
Figure 3:
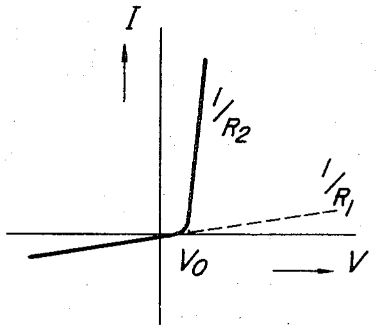
FIG. 3 is the voltage vs. current characteristic curve of the circuit of FIG. 2.

An example of the application of a variable resistance element to an electric circuit is a memory cell including multi-emitter type transistors, which is shown in FIG. 1. A memory cell comprises multiemitter type transistors 1 and 2, a resistance 3, a terminal 4 for applying a bias voltage, an address signal input terminal 5, and variable resistance elements 6 and 7. The resistances 6 and 7 have large values in stand-by time and small values in address time. To enhance the integration of the whole circuit, each of the variable resistance elements 6 and 7 is formed of resistances $R_1$ and $R_2$ and a diode D, as is shown in FIG. 2. A typical example of current vs. voltage characteristic of such a variable resistance element is shown in FIG. 3, indicating that the resistance of the element is $R_1$ and $R_2$ when the terminal voltage is below and above a certain value $V_o$ (the threshold voltage of the PN junction), respectively, provided that $R_1 >> R_2$.

Figure 4A:
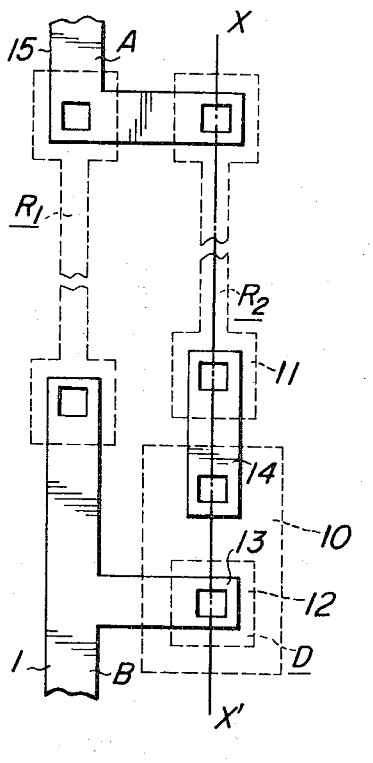
FIG. 4A PRIOR ART
FIGS. 4A and 4B are a top and a cross-sectional view of a conventional variable resistance element embodied in a semiconductor substrate.
Figure 4B:
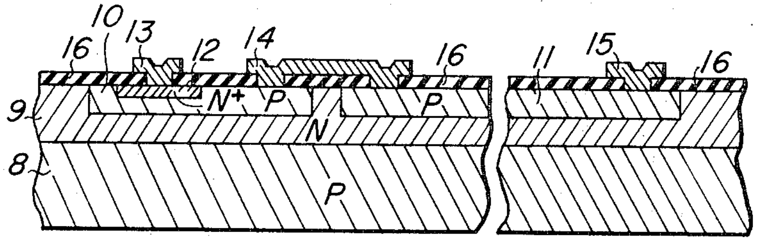
FIG. 4B PRIOR ART

An example of such variable resistance element embodied in the surface of a semiconductor substrate is shown in FIGS. 4A and 4B. FIG. 4A is a top plan view of a semiconductor substrate and FIG. 4B is a longitudinal cross-section of the semiconductor substrate along broken line X – X' of FIG. 4A. In FIG. 4B, reference numeral 8 indicates a semiconductor substrate, for example a P type silicon substrate, 9 an N type silicon epitaxial layer formed on one principal surface of the substrate 8, 10 and 11 P type regions formed on the epitaxial layer 9 by selective diffusion of P type impurity, the layer 11 being used as a resistive layer, 12 an N type layer formed in the P type layer 10 to form a diode therewith, 13, 14 and 15 electrodes formed by aluminum evaporation, and 16 an insulating layer formed of a conventionally known passivation film such as $SiO_2$, $Si_3N_4$, $Al_2O_3$, etc.

In the variable resistance element of FIGS. 4A and 4B, the resistances $R_1$ and $R_2$ and the diode D are individually formed on the semiconductor substrate 8 and then interconnected by metalization. Thus, the area on the semiconductor substrate occupied by the variable resistance element is relatively large, and the number of memory cells (bits) containable in a semiconductor chip of a certain area is limited.

Thus a semiconductor chip of large area is needed for integrating a large number of memory cells, which leads to a decrease in yield and a rise in manufacturing cost. Further, since the interconnection wiring becomes long, the stray capacitance of the circuit increases and the speed of the circuit decreases.

SUMMARY OF THE INVENTION

An object of this invention is to provide a variable resistance element of an improved structure suitable for integration of circuitry.

Another object of this invention is to provide a variable resistance element which is small in size and easy to manufacture.

According to a basic feature of this invention, there is provided a variable resistance element comprising a semiconductor substrate including a resistive region and PN junction formed adjacent to said resistive region, one electrode provided on the resistive region and the other electrode formed in such a manner that it substantially short-circuits the PN junction, thereby having a structure in which a resistance and a diode are connected in parallel.

That PN junction which is adjacent to the resistive region may be one formed by making a region of the opposite conductivity type in the resistive region or an emitter-base or base-collector junction of a transistor.

The resistive region, in the case of an integrated circuit, is formed of one selected from the group consisting of (1) a region formed in a semiconductor substrate surface at the time of the emitter diffusion of a transistor, (2) a region formed in a substrate surface at the time of the base diffusion of a transistor, (3) an epitaxial (collector) layer, (4) a pinched epitaxial layer, (5) a pinched base diffusion region, and combinations thereof.

Among the above items (1) to (5), the area resistivity tends to increase with the number. For example, an emitter diffused region has a resistivity of 2 to 10 Ω/□, a base diffused region 100 to 500 Ω/□, an epitaxial region 1 to 10 KΩ/□, a pinched epitaxial region 5 to 50 KΩ/□, and a pinched base diffused layer 10 to 100 KΩ/□

Thus, the structure of the present variable resistance element can be arbitrarily selected according to the specification of the circuit. It is necessary to consider the storage charged carriers in the diode formed as a constituent of the variable resistance element when the speed of the circuit is of importance. In a high speed circuit, a PN junction having few storage charged carriers is preferable and thus an emitter-base junction is preferably used. On the other hand where a PN junction is expected to have many storage charged carriers, a base-collector junction may be used.

DESCRIPTION OF THE PREFERRED EMBODIMENTS

For further understanding of the present invention, description will be made on preferred embodiments, hereinafter.

Embodiment 1

Figure 5B:
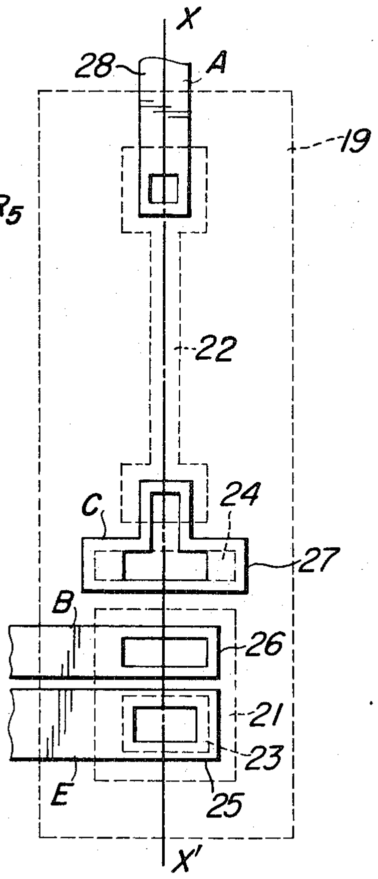
FIGS. 5A, 5B and 5C are an equivalent circuit diagram, a top and a cross-sectional view of a variable resistance element according to the invention.
Figure 5A:
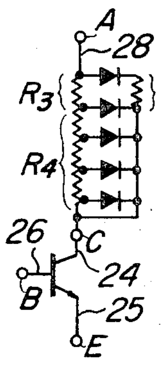
Figure 5C:
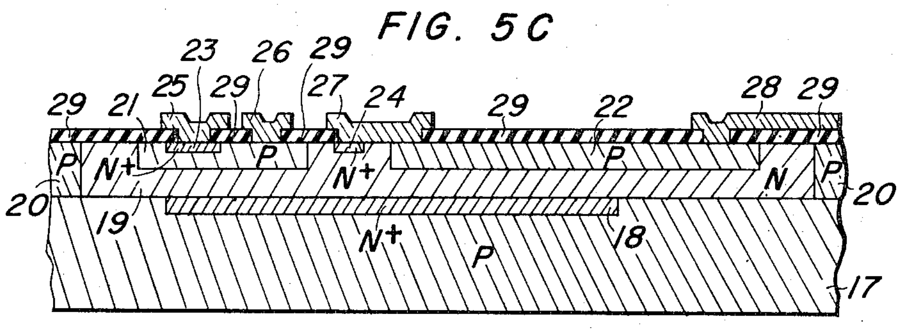

In the variable resistance element shown in FIGS. 5A to 5C, a resistive region is formed by diffusing impurity at the same time as formation of the base region of a transistor and a diode is formed by a PN junction made between said resistive diffusion region and the collector region of a transistor.

FIG. 5A shows an equivalent circuit of this embodiment, FIG. 5B shows a top view of the embodiment formed on a semiconductor substrate surface, and FIG. 5C shows a longitudinal cross-sectional view along line X – X' of FIG. 5B. In these figures, main parts are shown exaggerated out of scale. In manufacture of the device shown in FIGS. 5A to 5C, the planar technique widely used in semiconductor industries may be used.

For example, the following process may be adopted. First, in the surface of a P type silicon substrate 17, a heavily doped $N^+$ region 18 is formed by selective diffusion of N type impurity. This $N^+$ region is called a buried or embedded region and works to reduce the resistance of a high resistivity epitaxial layer to be formed thereon to a desired value. Next, an N type silicon epitaxial layer 19 having a conductivity of about 0.5 Ωcm is formed on the substrate surface to a thickness of about 30 $\mu$. This N type epitaxial layer is then electrically divided into a plurality of regions by P type diffusion regions 20 formed by isolation diffusion of P type impurity. Then, P type impurity is selectively diffused into said epitaxial layer to form the base region 21 of a transistor. At the time of this impurity diffusion, a resistive region 22 is also formed. After the base formation, an emitter region 23 and a collector electrode portion 24 are formed in said base region 21 and the collector region 19, respectively, by selective diffusion of N type impurity. Then, aluminum electrodes 25, 26, 27 and 28 are evaporated on the respective regions of the transistor and the resistive region. A conventional insulating film is used as a passivation film 29 of this semiconductor device. In this embodiment, a silicon oxide film of 7,000 A thickness was used.

An equivalent circuit of the device of FIGS. 5B and 5C is shown in FIG. 5A, in which terminals E, B, C and A correspond to those of FIG. 5B.

As is apparent from the comparison with the conventional device of FIGS. 4A to 5B, in the present device of FIGS. 5A to 5C, not only a variable resistance element but also a transistor are embodied in a relatively small area, showing a superior feature for the integration of a circuit.

Figure 6:
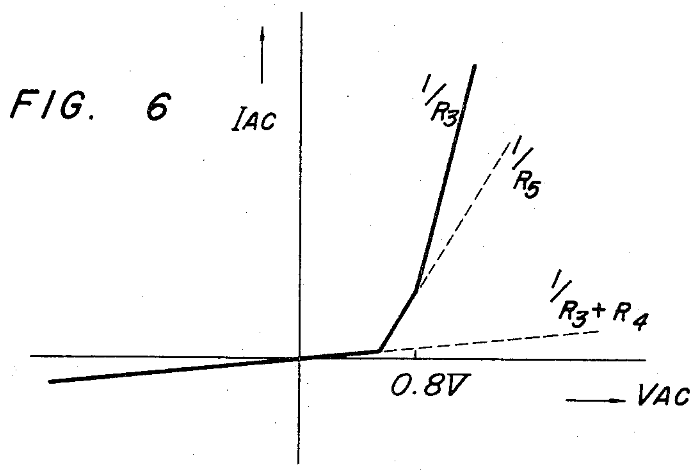
FIG. 6 is a voltage vs. current characteristic curve of the variable resistance element of FIGS. 5A to 5C.

FIG. 6 shows the voltage vs. current characteristic of the variable resistance element shown in FIGS. 5A to 5C. Referring to FIGS. 5A to 5C and 6, reference $R_5$ indicates the resistance of the epitaxial layer 19. That portion of the epitaxial layer which is adjacent to the embedded layer 18 having a very low resistance which in FIG. 5A approximated to be zero, does not constitute resistance in the circuit of FIG. 5A. References $R_3$ and $R_4$ are resistances of the P type impurity diffused resistive region 22, $R_4$ indicating the resistance of the portion over the embedded region 18 and $R_3$ the resistance of the remaining portion.

First, when the voltage between A and C is below about 0.5 V, since the voltage is below the threshold voltage of the respective distributed diodes, current is allowed to flow only through the impurity diffused resistive layer 22. Namely, a current determined by the resistance $R_3 + R_4$ is allowed to flow between A and C.

When the voltage between A and C becomes above about 0.5 V, the outermost of the distributed diodes becomes turned-on and a current determined by the resistance $R_5$ is allowed to flow.

When the applied voltage further increases above about 0.8 V, the distributed diode disposed over the edge of the embedded region 18 becomes turned-on and a current is allowed to flow through $R_3$ and the embedded region 18.

In the above manner, the resistance between A and C is varied according to the applied voltage.

Embodiment 2

Figures 7A, 7B, 7C:
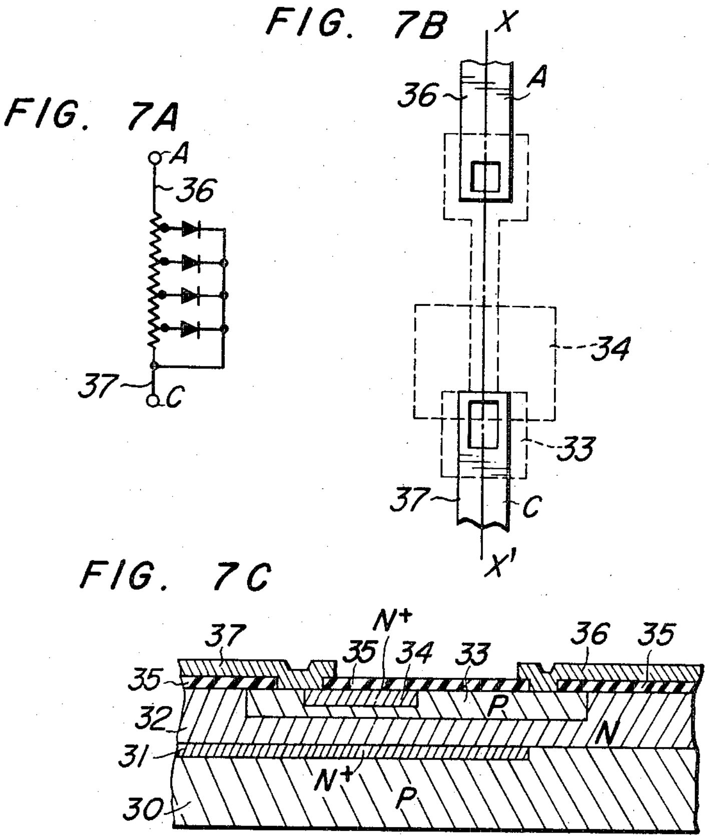
FIGS. 7A, 7B and 7C show another embodiment of a variable resistance element according to the invention.

FIGS. 7A to 7C show another embodiment in which a resistive layer is formed of a pinched base diffusion region, and a diode is formed of an emitter-base junction. FIG. 7A is an equivalent circuit diagram, FIG. 7B a top view and FIG. 7C a longitudinal cross section along line X – X' of FIG. 7B.

In FIG. 7C, in a P type silicon substrate 30 an $N^+$ type embedded region 31 is formed. An N type epitaxial layer 32 of high resistivity is formed on the silicon substrate surface. A P type region 33 is selectively formed in the epitaxial layer 32, and an $N^+$ type region 34 is then formed in the P type region 33. These regions 33 and 34 may be formed by various methods, but usually by selective diffusion of P or N type impurities. A passivation film 35 is formed on the substrate surface and is made of a conventional passivation film such as $SiO_2$, $Si_3N_4$, $P_2O_5 \cdot SiO_2$, $Al_2O_3$, etc. Electrodes 36 and 37 are formed by aluminum evaporation. The electrode 36 is connected to one end of the P type region 33 which works as a resistive region and the electrode 37 is connected to bridge or short-circuit the regions 33 and 34. An equivalent circuit of the device of FIGS. 7B and 7C is shown in FIG. 7A in which terminals A and C correspond to those in FIG. 7B.

Embodiment 3

Figure 8A:
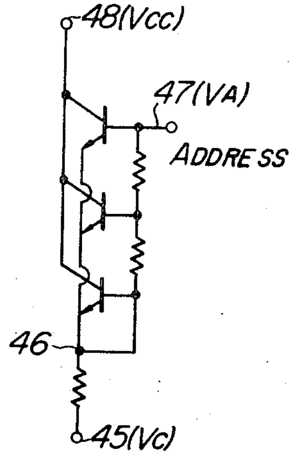
FIGS. 8A, 8B and 8C show yet another embodiment of a variable resistance element according to the invention.
Figure 8B:
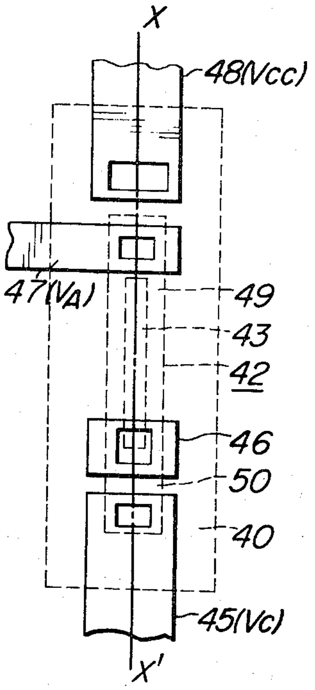
Figure 8C:
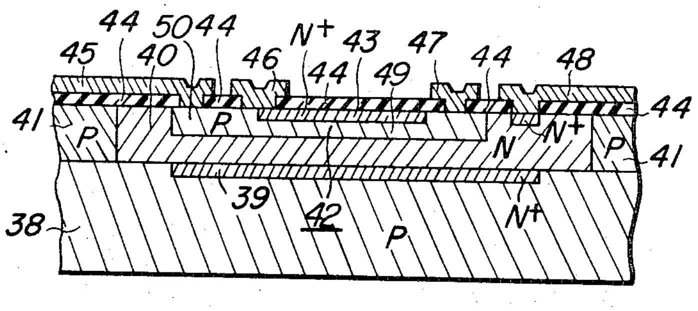

Further embodiment of a variable resistance element is shown in FIGS. 8A to 8C, in which a resistive region is formed of a base diffusion region and a diode is formed of an emitter-base junction of a few storage carriers.

FIG. 8A shows an equivalent circuit, FIG. 8B a top view and FIG. 8C a longitudinal cross section along line X – X' of FIG. 8B.

In FIG. 8C, reference numeral 38 indicates a P type silicon substrate, 39 an $N^+$ type embedded region, 40 an N type silicon epitaxial layer of high resistivity grown on the substrate 38, 41 P type impurity diffused regions for isolating the epitaxial layer into a plurality of regions, 42 a P type region formed in the epitaxial layer by selective diffusion of P type impurity, said P type region 42 being used as a base region for a transistor and a resistive region for a variable resistance element, 43 an N type impurity diffused region formed in the base region 42 and working as an emitter layer of the transistor. A passivation film 44 is provided on the silicon epitaxial layer. Aluminum electrodes 45, 46, 47 and 48 are also provided for interconnection of the circuit elements.

Figure 9:
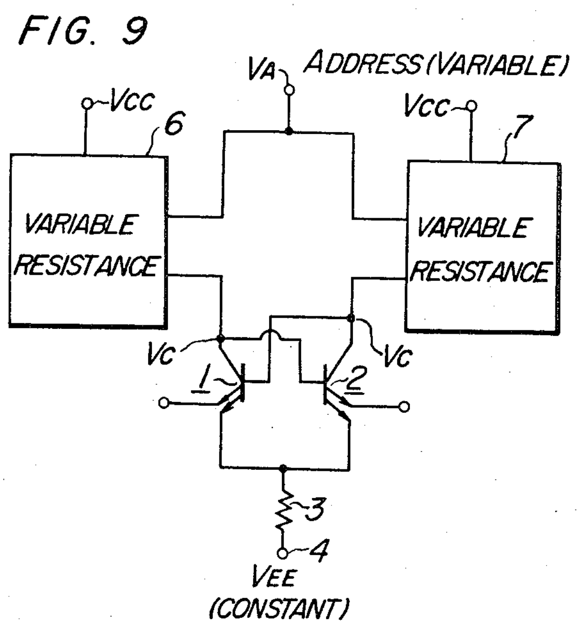
FIG. 9 shows the construction of a semiconductor memory cell to which the embodiment shown in FIGS. 8A, 8B and 8C is applied.

The variable resistance element is formed of the base region 42 and the emitter-base junction working as a diode. In FIG. 9, references $V_{CC}$, $V_A$ and $V_C$ correspond to those shown in FIGS. 8A and 8B. In the Figure, reference character $V_A$ designates an address signal input terminal, $V_C$ the collector terminals of transistors 1 and 2 connected to the variable resistance element, and $V_{CC}$ a power source terminal.

When the address potential of the $V_A$ terminal 47 is low, the PN junction of the base layer 42 and emitter layer 43 is not sufficiently biased in the forward direction, so that the transistor composed of the emitter layer 43, the base layer 42 and the collector layers 39 and 40 is cut off, and the current passing in the $V_C$ terminal 45 flows from the $V_A$ terminal 47 through the first resistance region 49 consisting of the pinched base region of the base layer 42. The current flowing at this time is small because of the large resistance of the first resistance region 49.

When the address potential of the $V_A$ terminal 47 increases, the PN junction of the base layer 42 and emitter layer 43 of the transistor mentioned above is biased in the forward direction and the transistor is turned on. The current passing in the $V_A$ terminal 47 in this case is the sum of the collector current passing from the $V_{CC}$ terminal 48 through the collector layers 39 and 40 and the emitter layer 43 of the transistior, and from the terminal 46 through the second resistance region 50 having a low resistance value, which is part of the base layer 42, to the $V_C$ terminal 45, and the base current passing from the $V_A$ terminal through the first resistance region 49. In this case, the apparent resistance is the resistance of the second resistance region 50 formed between the terminals 46 and 45, and this resistance is sufficiently small as compared with the resistance of the first resistance region 49. Thus, it will be understood that the above-described construction constitutes a variable resistance.

In FIG. 9, there is shown the construction of an example of a circuit in which the variable resistance element of the invention shown in FIGS. 8A, 8B and 8C is applied to a semiconductor memory cell.

In the event when a variable resistance element comprising a diode as shown in Embodiment 1 or 2 is used in the circuit shown in FIG. 1, a large current is to pass the terminal $V_A$ as the potential at said terminal is raised to the address potential, and it becomes impossible to drive concurrently a large number of the circuits shown in FIG. 1. On the contrary, when a variable resistance element comprising the transistors as shown in FIGS. 8A, 8B and 8C is used in the circuit shown in FIG. 9, a current which is extremely small as compared with the large current passing the $V_C$ terminal, only passes the $V_A$ terminal due to the amplifying effect of the transistor, so that a memory cell of a large capacity can be easily driven.

As can be seen from the foregoing description on the preferred embodiments, the following advantages can be provided according to this invention.

1. The area on a semiconductor substrate surface occupied by a variable resistance element can be reduced in size, enabling design of a high density integrated circuit. Namely, in a given semiconductor surface, a larger number of circuit elements can be installed, and the manufacture of an LSI is enhanced.

2. The manufacturing process is easy and simple. Namely, an emitter-base or a base-collector junction of a transistor can be utilized also as a diode which is a constituent of the inventive variable resistance element. Further, which PN junction is utilized can be arbitrarily selected according to storage time of minority carriers at the PN junction. Further, the variable resistance element can be formed during the same process as of forming the respective circuit elements of integrated circuit, such as transistors and diodes.

The variable resistance element according to the invention can be used either as a single element or one constituent of a function circuit such as a memory cell.

It is to be noted that this invention is not limited to the above embodiments but can be variously modified or altered within the spirit and scope of the invention.

We claim:

1. A variable resistance element comprising:
- a collector region of first conductivity type;
- a base region formed in said collector region and doped with an impurity of second conductivity type opposite to said first conductivity type, having a predetermined depth which is smaller than that of said collector region, said base region forming a first PN junction with said collector region;
- an emitter region of the first conductivity type formed in a part of said base region so as to form a pinched base region between said emitter region and said collector region, said emitter region forming a second PN junction with said base region, and said pinched base region being a first resistive region having a high resistance;
- a first metal electrode provided on one end portion of said base region;
- a second metal electrode formed to bridge said base region and said emitter region, a part of said base region between said first and second metal electrodes being a second resistive region having a low resistance;
- a third metal electrode disposed on a part of said base region, said third metal electrode being on the opposite side to said first and second metal electrodes with respect to said emitter region; and
- a fourth metal electrode disposed on a part of said collector region.

2. A variable resistance element according to claim 1, further comprising a semiconductor substrate of the second conductivity type and an isolating semiconductor region of the second conductivity type, said collector region and said isolating semiconductor region being disposed on said semiconductor substrate.

3. A variable resistance element according to claim 2, further comprising an embedded region of the first conductivity type and high impurity concentration formed in said semiconductor substrate and adjacent to said collector region, thereby adjusting the current vs. voltage characteristic of the variable resistance element.

4. A variable resistance element according to claim 1, further comprising means for applying a voltage between said second and third metal electrodes, so that the second PN junction is biased in the forward direction.

5. A variable resistance element according to claim 3, further comprising means for applying a voltage between said second and third electrodes, so that the second PN junction is biased in the forward direction.

* * * * *